United States Patent
Chen et al.

(10) Patent No.: US 10,783,978 B1
(45) Date of Patent: Sep. 22, 2020

(54) READ VOLTAGE-ASSISTED MANUFACTURING TESTS OF MEMORY SUB-SYSTEM

(71) Applicant: Micron Technology, Inc., Boise, ID (US)

(72) Inventors: Zhengang Chen, San Jose, CA (US); Tingjun Xie, Milpitas, CA (US); Steven M. Pope, Placerville, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/551,950

(22) Filed: Aug. 27, 2019

(51) Int. Cl.
| | |
|---|---|
| *G11C 16/26* | (2006.01) |
| *G11C 29/12* | (2006.01) |
| *G11C 11/409* | (2006.01) |
| *G11C 29/14* | (2006.01) |
| *G11C 29/50* | (2006.01) |

(52) U.S. Cl.
CPC ...... *G11C 29/12005* (2013.01); *G11C 11/409* (2013.01); *G11C 16/26* (2013.01); *G11C 29/14* (2013.01); *G11C 29/50* (2013.01)

(58) Field of Classification Search
CPC .................................. G11C 8/16; G11C 29/08
USPC ............................................ 365/201, 230.05
See application file for complete search history.

(56) References Cited

U.S. PATENT DOCUMENTS

| | | | | |
|---|---|---|---|---|
| 2010/0091537 | A1* | 4/2010 | Best | H01L 25/105 365/51 |
| 2011/0299317 | A1* | 12/2011 | Shaeffer | G11C 13/0035 365/106 |
| 2014/0040704 | A1* | 2/2014 | Wu | G06F 11/1068 714/773 |
| 2014/0082459 | A1* | 3/2014 | Li | G11C 29/52 714/773 |
| 2014/0208062 | A1* | 7/2014 | Cohen | G06F 3/0688 711/206 |
| 2014/0281121 | A1* | 9/2014 | Karamcheti | G06F 9/4881 711/102 |
| 2015/0039842 | A1* | 2/2015 | Fitzpatrick | G06F 12/00 711/154 |
| 2017/0236562 | A1* | 8/2017 | Varanasi | G06F 11/1068 365/189.15 |

* cited by examiner

*Primary Examiner* — Michael T Tran
(74) *Attorney, Agent, or Firm* — Lowenstein Sandler LLP

(57) ABSTRACT

A system includes memory dice, each having a register to store multiple read voltage levels. A processing device is to test each memory die by verification, via access to the multiple read voltage levels, whether each read voltage level falls within a corresponding relative voltage range. The processing device selects an initial read voltage level that achieves bit error rates not satisfying a threshold criterion at one of a first or a second shortest write-to-read (W2R) delay for the memory die and determines a bit error rate, using the initial read voltage level, of storage units of the memory die. The processing device reports the memory die as defective in response to one of: (i) a read voltage level, of the multiple read voltage levels, failing to verify; or (ii) the bit error rate of one or more storage units of the memory die satisfying the threshold criterion.

20 Claims, 8 Drawing Sheets

US 10,783,978 B1

READ VOLTAGE-ASSISTED MANUFACTURING TESTS OF MEMORY SUB-SYSTEM

TECHNICAL FIELD

Embodiments of the disclosure relate generally to memory sub-systems, and more specifically, related to read voltage-assisted manufacturing tests of memory sub-system.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
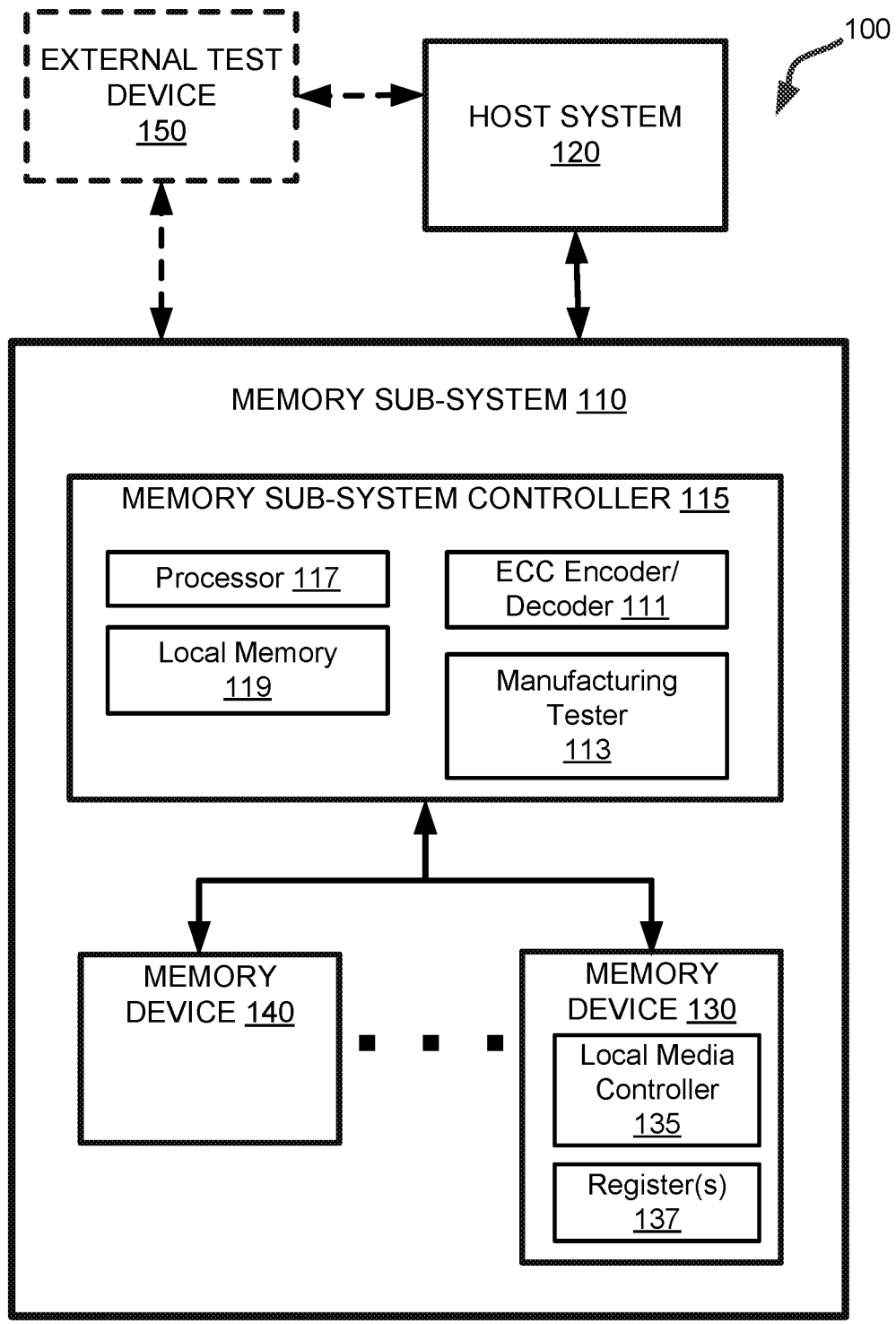
FIG. 1 illustrates an example computing environment that includes a memory sub-system in accordance with some embodiments of the present disclosure.

Aspects of the present disclosure are directed to read voltage-assisted manufacturing tests in memory sub-systems. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components or devices. The host system can provide data to be stored at the memory sub-system and can request data to be retrieved from the memory sub-system.

The memory sub-system can include multiple memory components or memory devices that can store data from the host system. A memory sub-system manufacturing test (sometimes called a "self-test") is a test flow run at manufacturing time to make sure that the memory sub-system meets a collection of technical specifications, e.g., functionality, temperature robustness, reliability, and the like. Examples of a memory sub-system tested in this way include, but are not limited to, a storage device that includes multiple memory dice or packages, a controller, a printed circuit board, and other components included within or associated with the memory sub-system. The memory sub-system can be incorporated within a larger computing device or drive, but for simplicity, the present disclosure will usually just refer to "memory sub-system."

In various embodiments, the manufacturing test flow can include, but is not limited to, testing the basic functionality of storage units that make up individual memory dice (or packages), where each storage unit includes one or more codewords. A codeword is a granularity of memory cells at which a memory controller writes to the memory sub-system and on which error-correcting code (ECC) encoding and decoding are performed. The manufacturing test flow can further include testing the pre-condition of the storage units, scanning and mapping out bad physical storage units, scanning and logging the memory health (e.g., via determination of raw bit error rates (RBER) or fail bit count (FBC)), stress test under certain conditions, such as temperature or pressure. The test flow can be executed as a self-test by the memory sub-system itself, or may be performed by an external test device.

The test flow is to be performed during manufacturing or re-manufacturing of the memory sub-system before the memory sub-system is shipped. If the memory sub-system fails during these manufacturing test flows, then the memory sub-system is not shipped. Because the test flow delays shipment of the memory sub-system, manufacturers endeavor to complete these tests as quickly as possible to maximize manufacturing throughput. Testing the quality of the storage unit of the memory sub-system, however, can take a significant amount of time. For example, the bit error rate (BER) of reading various storage units of individual memory dice can vary with time for reasons that will be explained with reference to FIG. 2. Because of this characteristic of the storage units and memory dice, multiple read voltage levels are used to correspond to different write-to-read (W2R) delays of the storage units, e.g., in order to adjust to time-varying BER and still be able to accurately read the storage units in the memory dice. A W2R delay is the period of time that passes between when data is written to a memory component and when the data is read from the memory component.

For these reasons, manufacturers conventionally test BER at each read voltage level (corresponding to different W2R delays) or only test for a static BER, not taking into account varying W2R delays during testing. Either of these approaches carries certain disadvantages. To test for all read voltage levels (and thus various expected W2R delays) is to perform BER tests on memory dice at read voltage levels corresponding to long W2R delays. In some cases, a single of such memory quality tests can take five hours or more, thus significantly delaying the manufacturing test flow and shipment of memory-based devices or drives. In contrast, to test for a static BER not dependent on time means an inadequate test of memory quality that fails to cover various W2R delays, and potentially missing certain defects. This approach can result in shipping bad memory sub-systems or drives to customers, which is an unwanted outcome.

Aspects of the present disclosure address the above and other deficiencies by taking a staged approach to manufacturing testing, thus seeking to detect certain defects early on and obviating the need for further testing when those defects are discovered. The disclosed testing approach also removes some unneeded testing. With relation to time-consuming testing, the present disclosure is particularly focused on read voltage-assisted manufacturing testing.

In various embodiments, the disclosed testing begins with verifying whether each read voltage level (stored separately on each memory die) falls within a corresponding relative voltage range (or absolute voltage range in another embodiment). If each read voltage level can be verified within a corresponding correct voltage range (whether relative or absolute), then the memory sub-system is expected to operate properly at different W2R delays. The testing may continue with selecting an initial read voltage level that achieves BER below a threshold criterion (e.g., a good BER) at one of a few shortest W2R delays, e.g., at a first, a second, or a third shortest W2R delay range. The testing may then continue with determining a BER, using the initial read voltage level, of storage units of the memory die, e.g., which involves writes and reads to the storage units.

The BER-related test can be repeated using another read voltage level, but focused on a read voltage level that achieves bit error rates not satisfying (e.g., below) the threshold criterion at another range of the shortest W2R delays, to keep testing short. If these BER test(s) are passed, further testing at voltage levels corresponding to longer W2R delays is unlikely to result in defect detection, and can be safely skipped. The testing may then continue with reporting any memory die as defective that either fail to verify one of the read voltage levels or for which a BER satisfies a threshold criterion of one or more storage units, e.g., exceeds a certain threshold value for the BER at the tested read voltage level. Different embodiments can set different numbers of storage units that satisfy the threshold criterion before considering the memory die defective (depending on quality level desired in shipped memory components or devices).

Advantages of the present disclosure include but are not limited to adding additional check criteria of read voltage levels performed before testing BER on the storage units of the memory sub-system. This additional test can effectively detect outlier or defective storage units (or memory dice) before more time-consuming testing is performed. The disclosed methods provide a systematic, efficient, and highly-flexible methodology for determining memory quality during manufacturing tests, which will be discussed with reference to FIGS. 5A-5B and FIGS. 6-7. Further, while simultaneously saving on testing time, there is a strong correlation between the manufacturing test results and actual memory sub-system quality, which improves the quality of end products shipped. Other advantages will be apparent to those skilled in the art in the features of the manufacturing test flow discussed hereinafter.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such. Each memory device 130 or 140 can be one or more memory component(s).

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components or devices, which can be an indirect communicative connection or direct communicative connection (e.g., without intervening components or devices), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

The cells can store one or more bits per cell. In one embodiment, each of the memory devices 130 can include one or more arrays of memory cells such as single level cells (SLCs), multi-level cells (MLCs), triple level cells (TLCs), or quad-level cells (QLCs), or a combination of such. In some embodiments, a particular memory component or device can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or codewords that can refer to a logical unit of the memory component or device used to store data. With some types of memory (e.g., NAND), pages can be grouped to form blocks. Some types of memory, such as 3D cross-point, can group pages across dice and channels to form management units (MUs).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. In some embodiments, the memory devices 130 are managed memory devices, which is a raw memory device combined with a local controller (e.g., the local media controller 135) for memory management within the same memory device package or memory die.

In some embodiments, the controller 115 includes an error-correcting code (ECC) encoder/decoder 111 and a manufacturing tester 113. The ECC encoder/decoder 111 can perform ECC encoding for data written to the memory devices 130 and ECC decoding for data read from the memory devices 130, respectively. The ECC decoding can be performed to decode an ECC codeword to correct errors in the raw read data, and in many cases also to report the number of bit errors in the raw read data.

In disclosed embodiments, the memory device 130 further includes one or more registers 137 to store the read voltage levels used for the memory device 130, e.g., which can represent a memory die or package for purposes of this disclosure. Accordingly, when performing read voltage-assisted testing, manufacturing tester 113 can access the multiple read voltage levels for a memory die stored in the one or more registers 137 on the memory die.

In embodiments, the manufacturing tester 113 can operate in conjunction with a processor 117 (together "processing device") to perform the manufacturing tests disclosed herein and handle logging, reporting (whether or not a memory die, package, or sub-system is defective), and retiring defective memory dice or devices. In alternative embodiments, the example computing environment 100 can further include an external test device 150 (e.g., an external processing device) that performs the manufacturing testing externally instead of the memory sub-system 110 performing the manufacturing tests on itself. Further details with regards to the operations of the manufacturing tester 113 (or optionally the external test device 150) are described below.

In some embodiments, the controller 115 includes at least a portion of the manufacturing tester 113. Further, the controller 115 can include the processor 117 (processing device) configured to execute instructions stored in local memory 119 for performing the operations described herein. In some embodiments, the manufacturing tester 113 is part of the host system 120, an application, or an operating system.

For certain memory types (e.g., NAND, phase change, etc.), the cell threshold voltage (Vt) distributions inherently move as a function of time. Therefore, at a given read level (e.g., the voltage applied to a memory cell as part of a read operation), the RBER can also change as a function of time. In particular, the Vt distribution and RBER can be a function of W2R delay, and the optimal read level or optimal read level voltage range that achieves the low BER also changes as a function of W2R delay.

Figure 2:
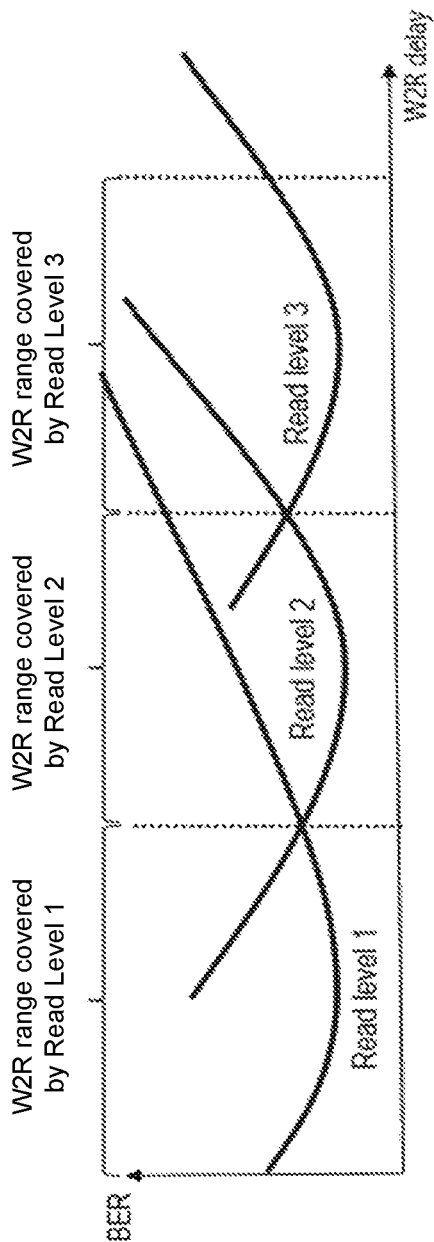
FIG. 2 is a graph that illustrates how bit error rate (BER) can change over time with varying write-to-read (W2R) delays in each of three read voltage levels, according to an embodiment.

FIG. 2 is a graph that illustrates how bit error rate (BER) can change over time with varying W2R delays in each of three read voltage levels, according to an embodiment. Due to the time-varying nature of the Vt distribution density, in addition to other noise mechanisms in memory, a single read voltage level is not sufficient to meet system reliability targets for memory cells. A single read level can achieve good BER for a certain sub-range of W2R delays, but not necessarily for other ranges of W2R delays. In various embodiments, multiple read levels (e.g., the illustrated three read voltage levels) can be used in combination to achieve low bit error rate (BER) for arbitrary W2R delay.

The three voltage levels of FIG. 2 are illustrated by way of example in association with low BER, but generally there can be L distinct read voltage levels ready to be used on any given memory die (or package) of the memory sub-system 110. Accordingly, assuming such L distinct read voltage levels are indicated by $V_1, V_2, \ldots, V_L$, which cover ranges of the shortest W2R delays, second shortest W2R delays, up to the longest W2R delays, then these read voltage levels can be expected to be increasingly larger as per $V_1 < V_2 < \ldots < V_L$. Because each read level covers a range of W2R delays, in each range the corresponding read voltage level is expected to have good BER results, e.g., BER not satisfying (e.g., below) a threshold criterion used to determine whether a memory or storage unit is defective. For best testing results, however, a particular W2R delay value associated with a read voltage level to be tested may be selected as corresponding to a bottom of the read voltage level curve, e.g., where BER is lowest.

Figure 3:
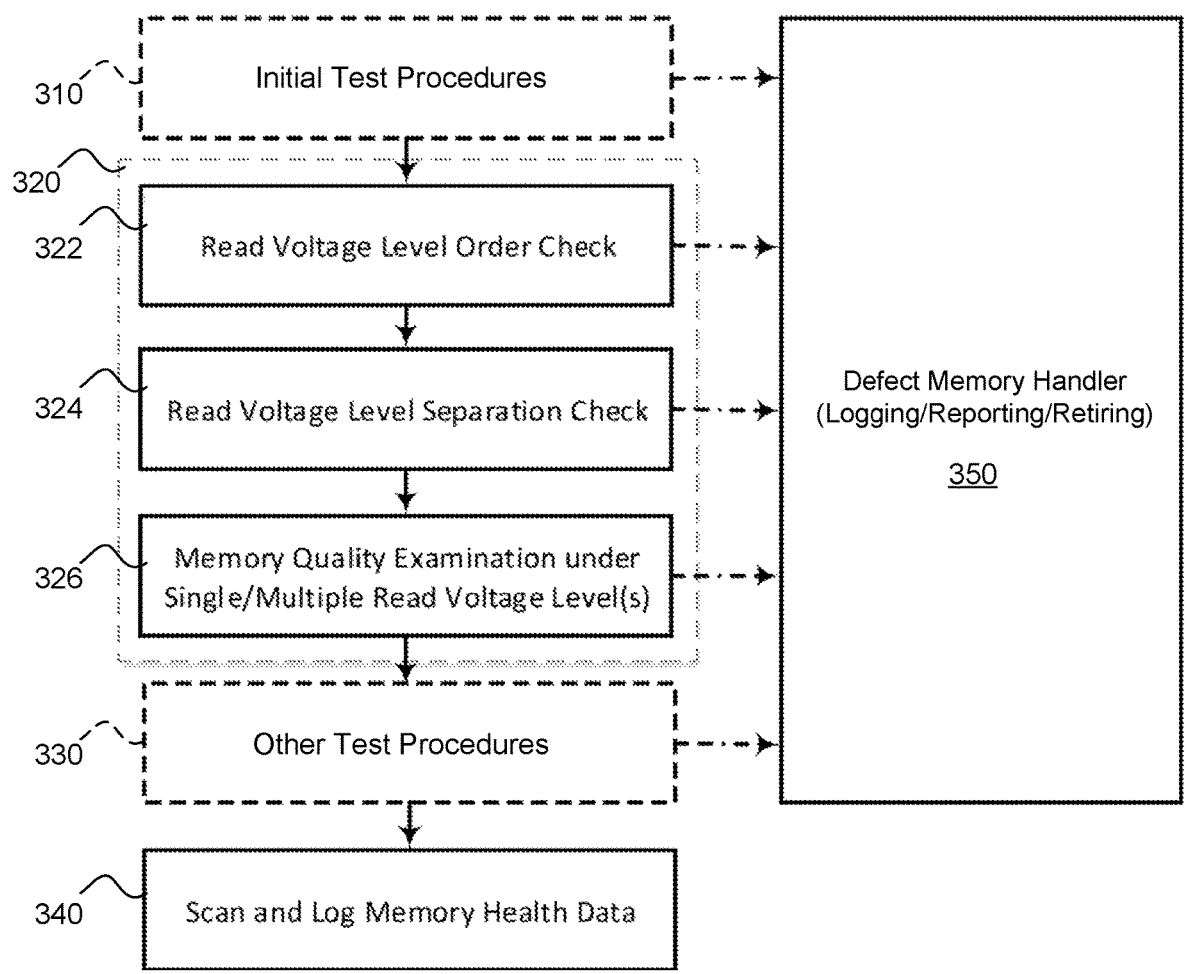
FIG. 3 is a flow diagram of a method for performing manufacturing tests on a memory sub-system according various embodiments.

FIG. 3 is a flow diagram of a method 300 for performing manufacturing tests on a memory sub-system according various embodiments. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the controller 115 (e.g., the manufacturing tester 113) and/or the external test device 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The test flow of the method 300 can be performed during manufacturing or re-manufacturing of the memory sub-system 110 before the memory sub-system is shipped. Re-manufacturing may occur to a memory sub-system 110 in a device that encountered an anomaly (e.g., damage from flow soldering) and which had to return to a certain point in the manufacturing process to resolve the anomaly. Sometimes a customer returns the memory sub-system that is defective for some reason, which device can also enter re-manufacturing. If the memory sub-system 110 fails during manufacturing or re-manufacturing test flows, then the memory sub-system 110 is not shipped.

With reference to FIG. 3, at operation 310, the processing logic optionally performs some initial test procedures, e.g., those not related to read voltage-assisted manufacturing tests. These initial test procedures may include basic functionality and pre-condition of the storage units of the memory dice of the memory sub-system 110. At operation 320, the processing logic performs a series of read voltage-assisted manufacturing tests, which may include but not be limited to, performance of operations 322, 324, and 326, as follows.

At operation 322, the processing logic performs a read voltage level order check of each memory die. As discussed, in memories with time-varying BER, there can be L distinct read voltage levels ready to be used and stored in the one or more register 137 of each memory die. To perform the read voltage level order check, the processing logic can identify $V_1, V_2, \ldots, V_L$ read voltage levels that cover the ranges of shortest W2R delays, $2^{nd}$ shortest W2R delays, to the longest W2R delays, respectively. The processing logic can then verify Vt settings of the memory die by verifying that the voltage levels that increase with longer W2R delays also increase in relative voltage, e.g., sequentially that $V_1 < V_2 < \ldots < V_L$. More specifically, the processing logic can verify that a second read voltage level is higher than a first read voltage level, a third read voltage level is higher than the second read voltage level, and optionally that a fourth read voltage level is higher than the third read voltage level of the multiple read voltage levels. If these inequalities hold true, then the memory die is not defective in its read voltage levels and can continue with manufacturing testing. In contrast, if these inequalities do not hold true, the memory die is regarded as defective and reported as such to a defect memory handler 350.

In various embodiments, the defect memory handler 350 may be a part of the controller 115, and optionally a part of the manufacturing tester 113. The defect memory handler 350 is to handle the logging, reporting, and retiring of storage units (such as a codeword or memory die level) that is determined to be defective via the manufacturing testing described herein. Among other defect criteria (such as program error, and the like), if a physical storage unit has bit error count (or BER) higher than the threshold criterion with a given read voltage and associated W2R delay, the physical storage unit can be marked as bad and retired. A defect table can be stored in the media that contain all bad physical units detected in manufacturing test, and can be used later in runtime by the memory sub-system to manage logical to physically mapping properly, avoiding storing data on bad memory locations. If the number of bad units in a memory die exceeds a threshold, the die may be declared defective and manufacturing test logs such data accordingly.

At operation 324, the processing logic performs a read voltage level separation check for each memory die. For example, the read voltage level should be a reasonable voltage range with respect to a corresponding W2R delay. What is reasonable can be determined by inherent physical and electrical characteristics of a storage unit as determined offline. For example, if $V_2$ is 350 millivolts (mV), then an appropriate range could be 300-400 mV. More generally, for a read voltage level $V_i$ other than $V_1$, let $V_{i,\ off\_max}$ and $V_{i,\ off\_min}$ be maximum and minimum allowable offsets between $V_1$ and $V_i$. Thus, if there is a $V_i$ (i=2, ..., L) such that $(V_i < V_1 + V_{i,\ off\_min})$ or $(V_i > V_1 + V_{i,\ off\_max})$, the memory die is regarded as defective because $V_i$ is outside a threshold or predetermined voltage range defined by the offsets. Otherwise, if the read voltage level falls within the correct voltage range, then the memory die is not defective and manufacturing testing can continue. If the testing results in detecting a defective memory die, the processing logic reports the defect to the defect memory handler 350 as before. Note that the read voltage levels are specific to each memory die, and, indeed, can vary significantly across the multiple memory dice. Accordingly, the minimum and maximum allowable offsets are also specific for each respective memory die, and can also be stored in the one or more register 137.

Figure 4:
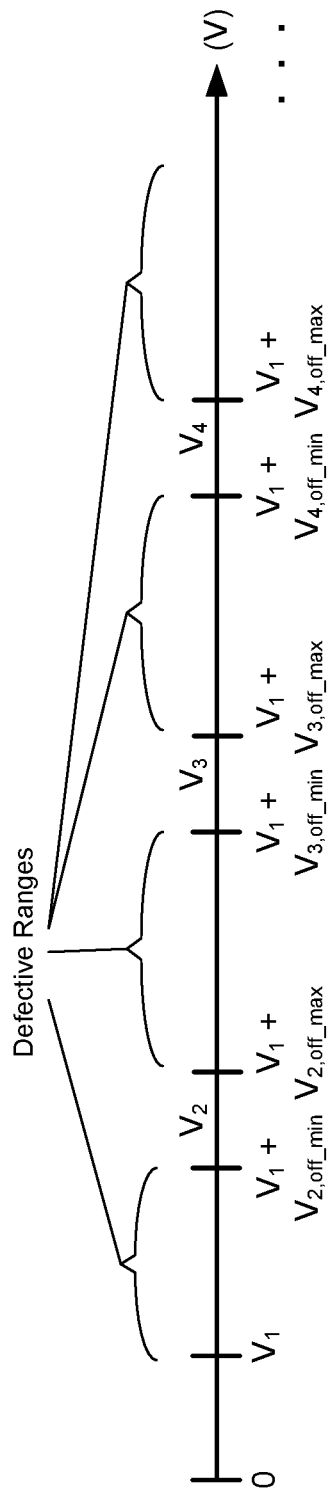
FIG. 4 is a graph to illustrate specific voltage ranges for performing read voltage level separation checks according to an embodiment.

FIG. 4 is a graph to illustrate specific voltage ranges for performing read voltage level separation checks according to an embodiment. More specifically, the processing device can verify that a second read voltage level ($V_2$) falls between a first read voltage level ($V_1$) plus a first minimum offset voltage ($V_{2,\ off\_min}$) and the first read voltage ($V_1$) level plus a first maximum offset voltage ($V_{2,\ off\_max}$). The processing device can further verify that the third read voltage level ($V_3$) falls between the first read voltage level ($V_1$) plus a second minimum offset voltage ($V_{3,\ off\_min}$) and the first read voltage level ($V_1$) plus a second maximum offset voltage ($V_{3,\ off\_max}$). In the illustrated embodiment, the second minimum offset voltage is greater than the first minimum offset voltage, and the second maximum offset voltage is greater than the first maximum offset voltage (and can be multiples of each other). The processing logic can further verify that the fourth read voltage level ($V_4$) falls between the first read voltage level ($V_1$) plus a third minimum offset voltage ($V_{4,\ off\_min}$) and the first read voltage level ($V_1$) plus a third maximum offset voltage ($V_{4,\ off\_max}$). In the illustrated embodiment, the third minimum offset voltage is greater than the second minimum offset voltage, and the third maximum offset voltage is greater than the second maximum offset voltage (and can be multiples of each other). These comparisons of relative voltages can continue through L read voltage levels.

With resumed reference to FIG. 3, at operation 326, the processing logic performs a memory quality examination (e.g., a bit error rate check) under one or more voltage levels that achieve (e.g., are expected to achieve) bit error rates (BERs) below a threshold criterion at the shortest write-to-read (W2R) delay range for the memory dice. In the disclosed embodiments, tests at read voltage levels corresponding to long W2R delays are removed to reduce manufacturing test duration. In some embodiments, the read voltage levels corresponding to the shortest or the second shortest W2R delay can be used for this memory quality test, where the shortest W2R delay can be difficult for testing in some cases if the shortest W2R delay is at a nanosecond delay level for reasons that will be discussed. For example, an efficient and highly-flexible approach for testing memory quality is discussed below with reference to FIGS. 5A-5B. If the memory quality (e.g., read BERs) at the one or more voltage levels do not meet a threshold criterion, then the memory quality examination passes and the method 300 can continue with additional manufacturing testing. Otherwise, if the BER of a memory die meets (or exceeds) the threshold criterion, then the memory die is reported as defective to the defect memory handler 350 for handling the defect. Depending on BER or an ECC control word (CW) FBC profile (e.g., max FBC) of storage units or dice, the defect memory handler 350 can retire, log, and report individual storage units or dice, respectively. In the case of storage units, the die could still be usable with a number of storage units retired. If the entire memory die is reported as defective, the memory die is to be retired. Additional or different criteria (in addition to BER or FBC) are envisioned for testing purposes.

At operation 330, the processing logic performs other or additional tests procedures, as may be required to complete manufacturing testing, which can include, for example, mechanical tests of the memory dice or of the entire memory device or drive. At operation 340, the processing logic scans and logs memory health data at the termination of all manufacturing testing or the like. One example of such data is the per-CW bit error count histogram for each die (or some sub-die physical units as layered in 3D cross-point memory, plane/block in NAND, and the like). These data can be used for runtime media management in the memory sub-system, and can also be used to improve memory component manufacturing flow, such as screening.

Figure 5A:
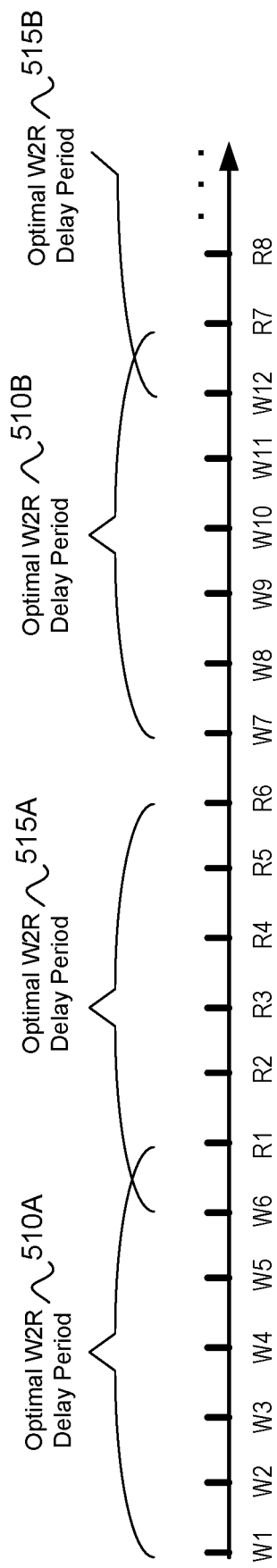
FIG. 5A is a graph to illustrate use of a staggering groups of write operations with groups of read operations to test memory quality under a selected read voltage level according to some embodiments.

FIG. 5A is a graph to illustrate use of a staggering groups of write operations with groups of read operations to test memory quality under a selected read voltage level according to some embodiments. Conventionally, a memory quality manufacturing test is performed via writing to a storage unit (e.g., flash block in NAND) followed by read of the storage unit (page by page) before repeating writing/reading to/from a subsequent storage unit (with no other operations coming in between and ignoring implications of W2R delay), for purposes of determining the RBER of each storage unit. The write/read is aligned to a block unit in NAND due to the need of having a fully programmed block before performing BER (or other defect) scan. This conventional approach, however, can be time-consuming particularly as the write-to-read (W2R) delays increase, forcing numerous delays in attempting to scan test the entire memory device 130.

To address the deficiencies in the above-described conventional approach, the graph in FIG. 5A illustrates how a test processing device can iteratively: (1) sequentially write data to a number of the storage units of the memory die until expiration of an optimal W2R delay period, which can also consider other delay factors such as controller delay, and (2) sequentially read, using the selected read voltage level for testing, the data from the number of the storage units of the memory die until the previously written storage units are read. "Sequentially write" hereinafter refers to writing data to sequentially numbered storage units on the memory die. "Sequentially read" hereinafter refers to reading data from the sequentially numbered storage units on the memory die. Following this staggered approach, within a series of read operations following a series of write operations, each read operation can be performed at the optimal W2R delay period from its corresponding write operation for a storage unit of the number of storage units.

For example, a first series of sequential write operations (W1 to W6) are performed during an optimal W2R delay period 510A followed by a first series of sequential read operations (R1 to R6) to sequentially read the storage units that were previously written. Because a first read operation (R1) corresponds to the first write operation (W1), these memory operations are separated by the optimal W2R delay period 510A. Further, because the last read operation (R6) corresponds to the last write operation (W6), these memory operations are separated by an optimal W2R delay period 515A. This staggered approach can continue by performing a second series of write operations (W1 to W12) during an optimal W2R delay period 510B followed by a second series of read operations (R7 to R12) to sequentially read the storage units that were previously written. Because a first read operation (R7) corresponds to the write operation (W7), these memory operations are separated by the optimal W2R delay period 510B. Further, because the last read operation (R12) corresponds to the last write operation (W12), these memory operations are separated by an optimal W2R delay period 515B. In this way, the timing between each write operation and each corresponding read operation is at a constant pace assuming the optimal W2R delay periods are equal. Accordingly, in an ideal scenario, the optimal W2R periods 510A, 510B are equal to the optimal time periods 515A, 515B, respectively, but non-idealities may create some mismatches of these time periods, which is addressed below with reference to FIG. 5B.

In embodiments, the write operations and the corresponding read operations (to read the previously written data) are made at an identical constant pace of writing and reading. An "optimal" W2R delay period can be defined as a period of time that it takes to fill up a data bus of write operations. (The optimal W2R delay period can be further adjusted in some embodiments to account for additional delays due to non-idealities in storage units or due to controller delay.) Because it takes this amount of time to queue up the next series of write operations, it is most efficient to perform a certain number of write operations before reading the results of those write operations in order to gather BER results. In this way, the data bus is refilled while the read operations are performed, and the iterative cycle can restart upon completion of reading the previously-written storage units. The memory quality testing approach of FIG. 5A is therefore much more efficient and faster than the conventional approach, enabling completion of manufacturing testing quicker so as not to delay shipment of the memory sub-system 110. Meanwhile, the processing device can determine and track the BER based on the sequential reading of the data from the number of the storage units of the memory die as discussed herein. If the BER is too high in relation to the corresponding W2R delay period, the memory sub-system is determined to be defective.

Figure 5B:
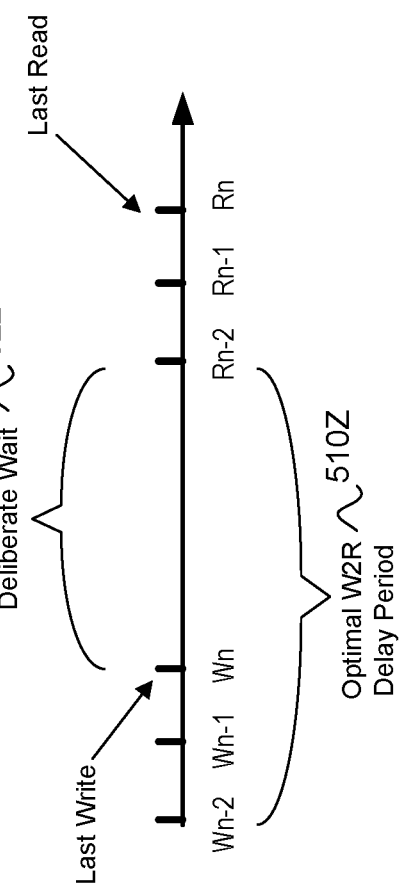
FIG. 5B is a graph to illustrate a final portion of the memory quality test of FIG. 5A in which a deliberate wait period is inserted within a final write operation to complete an entire optimal W2R delay period according to an embodiment.

FIG. 5B is a graph to illustrate a final portion of the memory quality test of FIG. 5A in which a deliberate wait period 522 (e.g., some additional delay) is inserted within a final write operation to complete an entire optimal W2R delay period according to an embodiment. More specifically, the processing device can, during a last sequential write operation to a last number of the storage units (Wn−2 to Wn) of the memory die, necessitate the additional delay in sequential writing until reaching the expiration of a current optimal W2R delay period 510Z. The processing device can further sequentially read from the last number of the storage units (Rn−2 to Rn) to complete the staggered memory quality test.

In practical embodiments, there can be non-idealities of division between storage units that causes any given W2R delay period (for a series of write operations) to differ from the optimal W2R delay period. In such cases, the processing device can inject a small additional delay similar to the deliberate wait 522 of FIG. 5B in any on-going W2R delay period for the series of write operations (e.g., of FIG. 5A) in order to reach the end of a current optimal W2R delay period (e.g., 510A or 510B). In this way, the constant pace of writing and reading can be controlled to maximize speed of the BER-related testing, and any additional delay caused by such a deliberate wait period is negligible relative to total test time.

Figure 6:
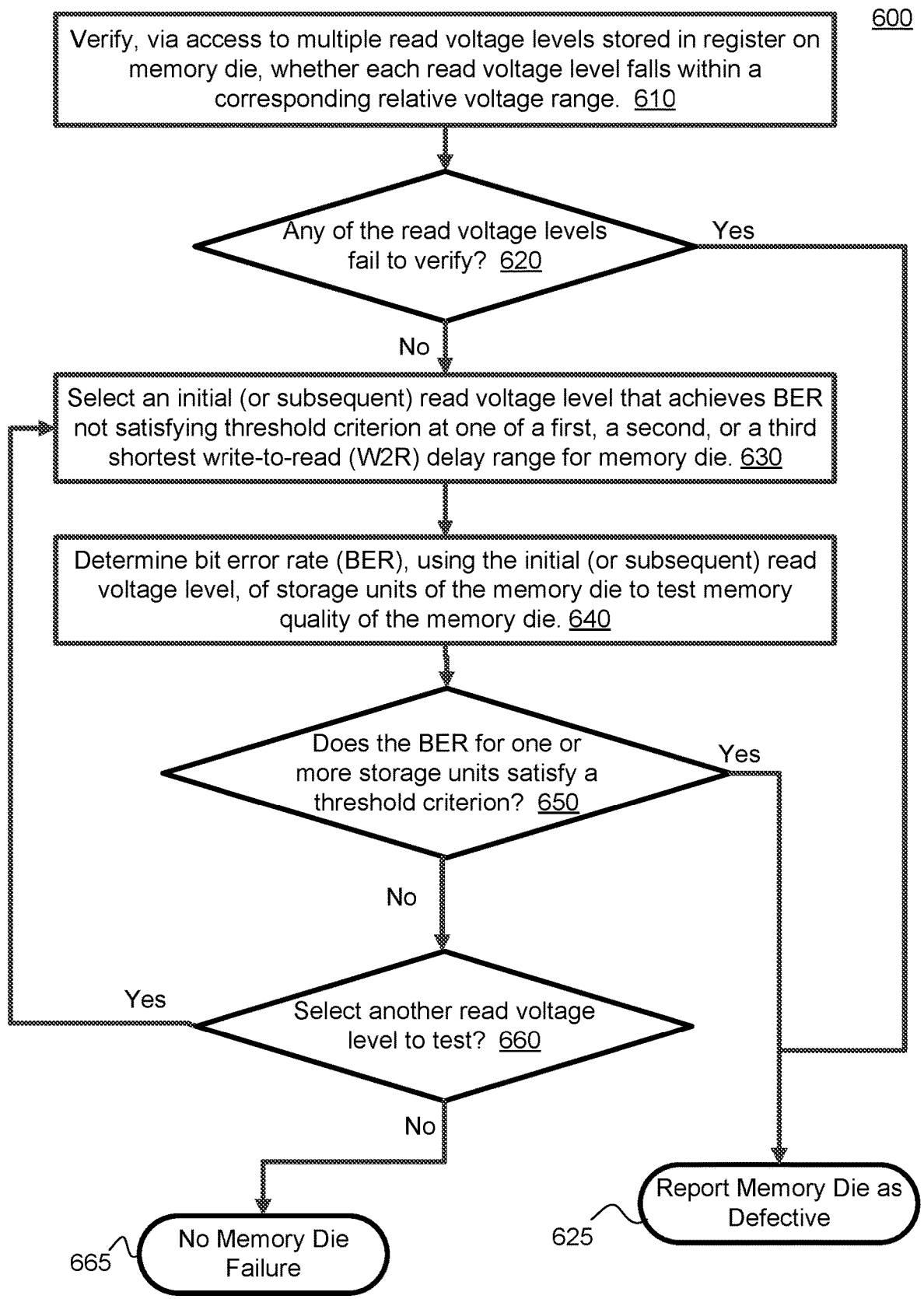
FIG. 6 is a flow diagram of an example method for execution of read voltage-assisted manufacturing tests of a memory sub-system according to various embodiments.

FIG. 6 is a flow diagram of an example method 600 for execution of read voltage-assisted manufacturing tests of a memory sub-system according to various embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the controller 115 (e.g., the manufacturing tester 113) and/or the external test device 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Because read voltage levels of each memory die (or other memory package) can vary across different memory dice, the manufacturing testing of method 600 can be performed iteratively (or in parallel) on each memory die, but with memory-die specific read voltage levels. The method 600 of FIG. 6 therefore is explained generally as to a single memory die, but is applicable to multiple memory dice, whether tested in parallel or in series. At operation 610, the processing logic verifies, via access to the multiple read voltage levels stored in the register 137 of a memory die, whether each read voltage level falls within a corresponding relative voltage range. In other embodiments, this check can be to verify the multiple read voltage levels against absolute voltage levels expected at the memory die. This manufacturing test can be performed via execution of operation 322 and/or of operation 324 in the method 300 of FIG. 3. If performed sequentially, determining that a memory die fails one of these tests obviates the need to do further testing, as the memory die can be reported as defective.

At operation 620, the processing logic determines whether any of the read voltage levels fail to verify in operation 610. If yes, there is at least one read voltage level that fails to verify, at operation 625, the processing logic reports the memory die as defective. If no, the read voltage levels all correctly verify, at operation 630, the processing logic selects an initial read voltage level, of the multiple read voltage levels, that achieves bit error rates (BERs) not satisfying (e.g., below) a threshold criterion at one of a first, a second, or a third shortest write-to-read (W2R) delay range for the memory die. This initial read voltage level can correspond, therefore, to one of the first three read voltage levels ($V_1$, $V_2$, or $V_3$), as discussed with reference to FIGS. 2-4, in terms of the characteristics and design of the memory die being able to reach certain BER levels at corresponding W2R delay ranges. In other embodiments, the available read voltage levels available for memory quality testing are further limited to the first two read voltage levels ($V_1$ or $V_2$) or the second two read voltage levels ($V_2$ or $V_3$).

At operation 640, the processing logic determines a bit error rate (BER), using the initial read voltage level, of storage units of the memory die to test memory quality of the memory die. As mentioned, each storage unit can be made up of one or more codewords, the granularity for which the ECC encoder/decoder 111 can verify the correctness of data being stored or retrieved from the memory device 130. The manufacturing performed at operation 640 can be executed as explained with reference to operation 326 of FIG. 3, among other methods.

At operation 650, the processing logic determines whether the BER (determined at operation 640) of one or more storage units satisfies a threshold criterion. This threshold criterion may be a threshold BER value over which the one or more storage units is (or are) considered defective as a result of its diminished memory quality. If the BER does satisfy the threshold criterion of one or more storage units, at operation 625, the processing logic can report the memory die as defective. In some embodiments, a single storage unit satisfying the threshold criterion is sufficient to report the memory die as defective. In others, a threshold number of storage units are to be considered defective before the memory die as a whole is considered defective. For example, a defect table can be updated each time a storage unit is reported as defective (to optionally include identification of each defective storage unit). The memory die is reported as defective when the number of storage units reported (or recorded) as defective exceeds the threshold number. In still further embodiments, the BER for the entire memory die can be averaged over all tested storage units continuously, and when the average BER exceeds the threshold criterion during the testing, the memory die can be reported as defective. Additional methods for employing BER results for individual storage units in comparison to the threshold criterion are envisioned.

Otherwise, the processing logic can continue with, at operation 660, determining whether to test another read voltage level. In one embodiment, the number of read voltage levels is pre-selected and tests for each pre-selected voltage level is completed before reporting that there is no memory failure at operation 665. Because BER can change depending on W2R delay range of a read voltage level (even if only slightly), each test at a different read voltage level can be assessed with reference to a different threshold criterion of BER in some embodiments. Alternatively, or additionally, selection of a subsequent voltage level at operation 660 for which to test can be decided based on a rule or some predefined criteria.

For example, the processing logic can apply a rule to decide whether (and how much) the first BER value exceeds an initial threshold criterion associated with the initial read voltage level. If the first BER does not exceed the initial threshold criterion (e.g., for any storage units), the memory die can be reported as not defective at operation 665. If the first BER exceeds the initial threshold criterion, but is within five to ten percent (or some other low threshold percentage) of the initial threshold criterion, the processing logic can decide, at operation 660, to run a second BER test as a confirmation check on memory quality level. The second BER test can be run at a secondary read voltage level (e.g., at a higher W2R delay range) and thus with a comparison against a second threshold criterion (that is higher than the initial threshold criterion, if only slightly). If the memory die passes this second BER test, there is still no defect for memory quality purposes. This process can be layered into additional tests with different threshold criterion(s) for different read voltage levels. It is intended, however, that the method 600 is not to step through and do a memory quality test using every read voltage level, so as to avoid doing the memory quality test using a read voltage level corresponding to the longer (and certainly the longest) W2R delays.

If the BER-based memory quality test passes at the initial read voltage level and no additional manufacturing testing is to be performed at another read voltage level, at operation 665, the processing logic reports there is no memory die failure. Assuming all the memory dice pass, the processing logic reports the memory device 130 as having passed the read voltage-assisted manufacturing tests. If however, at operation 660, there is another read voltage level to memory quality test (as discussed above), the processing logic loops back to operation 630 to select a subsequent read voltage level for BER testing, followed by operations 640 and 650, performed iteratively.

More specifically, by way of example, at operation 630, the processing logic selects a secondary read voltage level of the multiple read voltage levels that achieves BER below the threshold criterion at another of the first, the second, or the third shortest W2R delay range for the memory die. At operation 650, the processing logic determines a second bit error rate (BER), using the secondary read voltage level, of storage units of the memory die. At operation 625, the processing logic reports the memory die as defective in response the second BER of one or more storage units of the memory die satisfying the threshold criterion. Or, at operation 665, the processing logic reports that there is no memory die failure if the second BER level did not exceed the threshold criterion. This testing can be iterated through for a third voltage level, for example.

Figure 7:
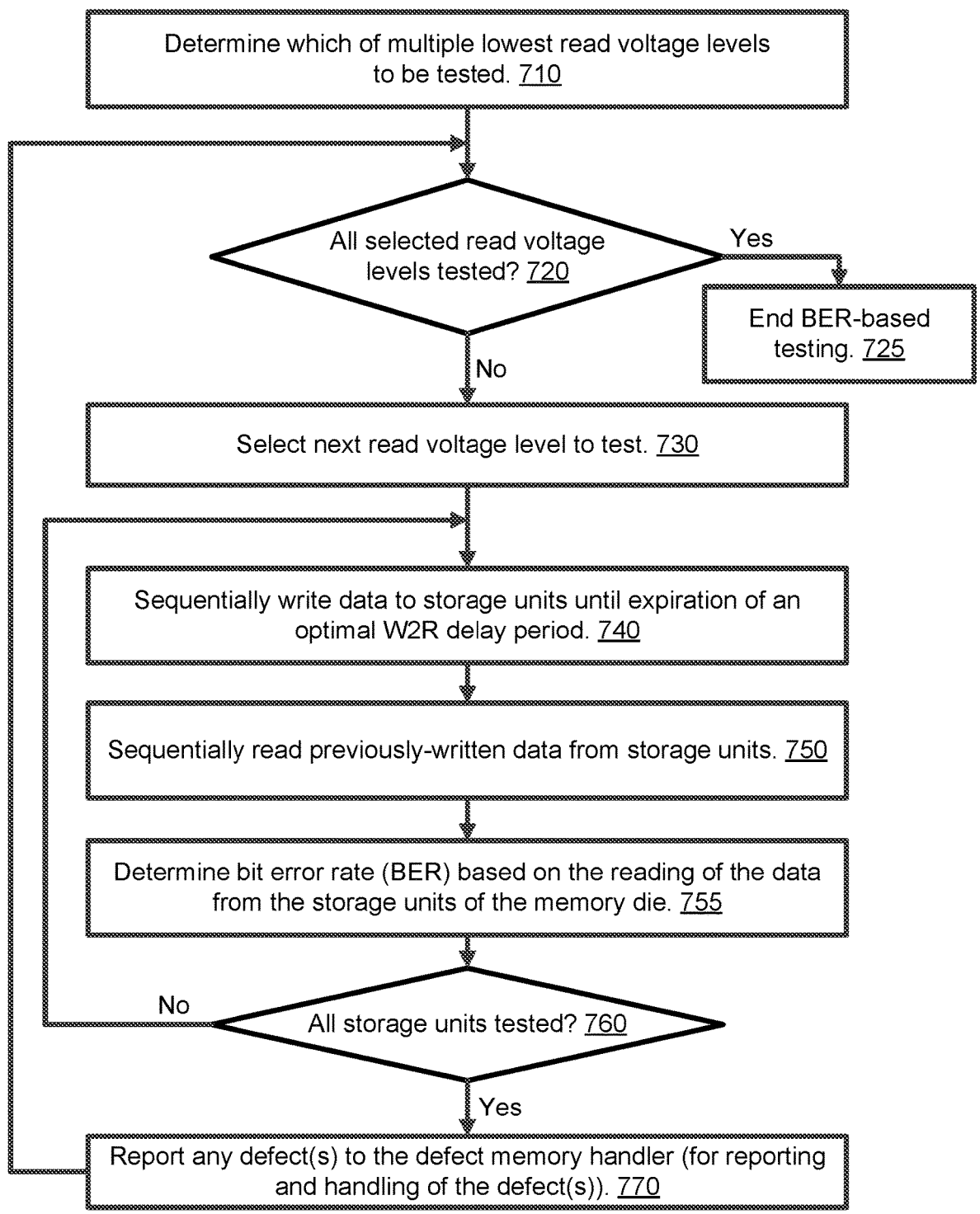
FIG. 7 is a flow diagram of an example method for execution of a memory quality test using one or more read voltage levels according to various embodiments.

FIG. 7 is a flow diagram of an example method 700 for execution of a memory quality test using one or more read voltage levels according to various embodiments. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the controller 115 (e.g., the manufacturing tester 113) and/or the external test device 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic determines which of the multiple lowest read voltage levels to be tested. This could be a predetermined decision to test one, two, or all three, of the three lowest read voltage levels ($V_1$, $V_2$, or $V_3$), as discussed with reference to FIGS. 2-4 and 6. For example, in some embodiments, the processing logic decides to perform tests on the second lowest read voltage level or on the second and third lowest read voltage levels. This may enable testing at a high enough W2R delay, but not at such a fast W2R (of the lowest read voltage level) that testing BER accurately is difficult. In future embodiments, it may be advantageous to also test the fourth lowest read voltage level ($V_4$) or higher, and so reference to just the three lowest read voltage levels is not be limiting as long as the highest read voltage levels corresponding to the longest W2R delays are excluded.

At operation 720, the processing logic determines whether all the selected read voltage levels have been tested. If the answer is yes, at operation 725, the method 700 to perform the memory quality examination is complete. If the answer is no, at operation 730, the processing logic selects the next read voltage level to test. For example, the processing logic can sequentially step through the read voltage levels that have been selected to be tested.

At operation 740, the processing logic sequentially writes data to storage units of the memory die until expiration of an optimal W2R delay period, e.g., the optimal W2R delay period 510A of FIG. 5A associated with the current read voltage level being tested. As discussed with reference to FIG. 5B, this optimal W2R delay may include an additional delay such as the deliberate wait 522, and thus when "optimal W2R delay" is referred to herein, it is understood to optionally include some additional wait period to account for slightly inconsistent W2R delay periods. At operation 750, the processing logic sequentially reads the previously-written data from the storage units of the memory die, e.g., until expiration of another optimal W2R delay period to keep on the constant pace of the staggered write/read approach. For example, the reading can occur during a sequentially-next optimal W2R delay period during the manufacturing testing.

In various embodiments, different aspects of the testing at operations 740 and 750 are performed serially and/or in parallel. For example, multiple dice in the sub-system 110 on a single or multiple data buses can allow these operations to be performed in parallel. Write/read of physical storage units in a single memory die (or logical unit) can be sequential in the staggered approach. However, this does not mean the write/read of each storage unit cannot take advantage of a concurrency feature of that memory die (or logical unit). For example, if the memory sub-system 110 supports concurrency of partitions in a die, such concurrency can be leveraged by this manufacturing test flow to minimize manufacturing time.

At operation 755, the processing logic determines the bit error rate (e.g., read BER) based on the reading of the data from the storage units of the memory die. In some embodiments, this BER is the result of operation 640 (FIG. 6), based on which the processing logic can determine whether there is memory quality-based defect in the memory die as discussed with reference to FIG. 6.

At operation 760, the processing logic determines whether all the storage units of the memory die have been tested. If not, the processing logic loops back to continue the sequentially writing of data to a series of storage units and reading of data from the series of storage units as performed at operations 740 and 750. At operation 770, once all the storage units have been tested, the processing logic can report, to the defect memory handler 350, any outlier or defect detected in the storage units of the memory dice being tested at the selected read voltage level. For example, a defect can be detected in a read BER determined to be above the threshold criterion of a BER value for the corresponding read voltage level. The defect of any one or a group of storage units can be enough to consider the memory die defective, e.g., as discussed in relation to operation 650 of FIG. 6. The method 700 loops back to operation 720, where the processing logic can again determine whether all the selected read voltage levels have been tested. If not, the testing continues with operations 730 et. seq. If, however, all read voltage levels have been tested, the memory quality examination for the memory device 130 is complete.

Figure 8:
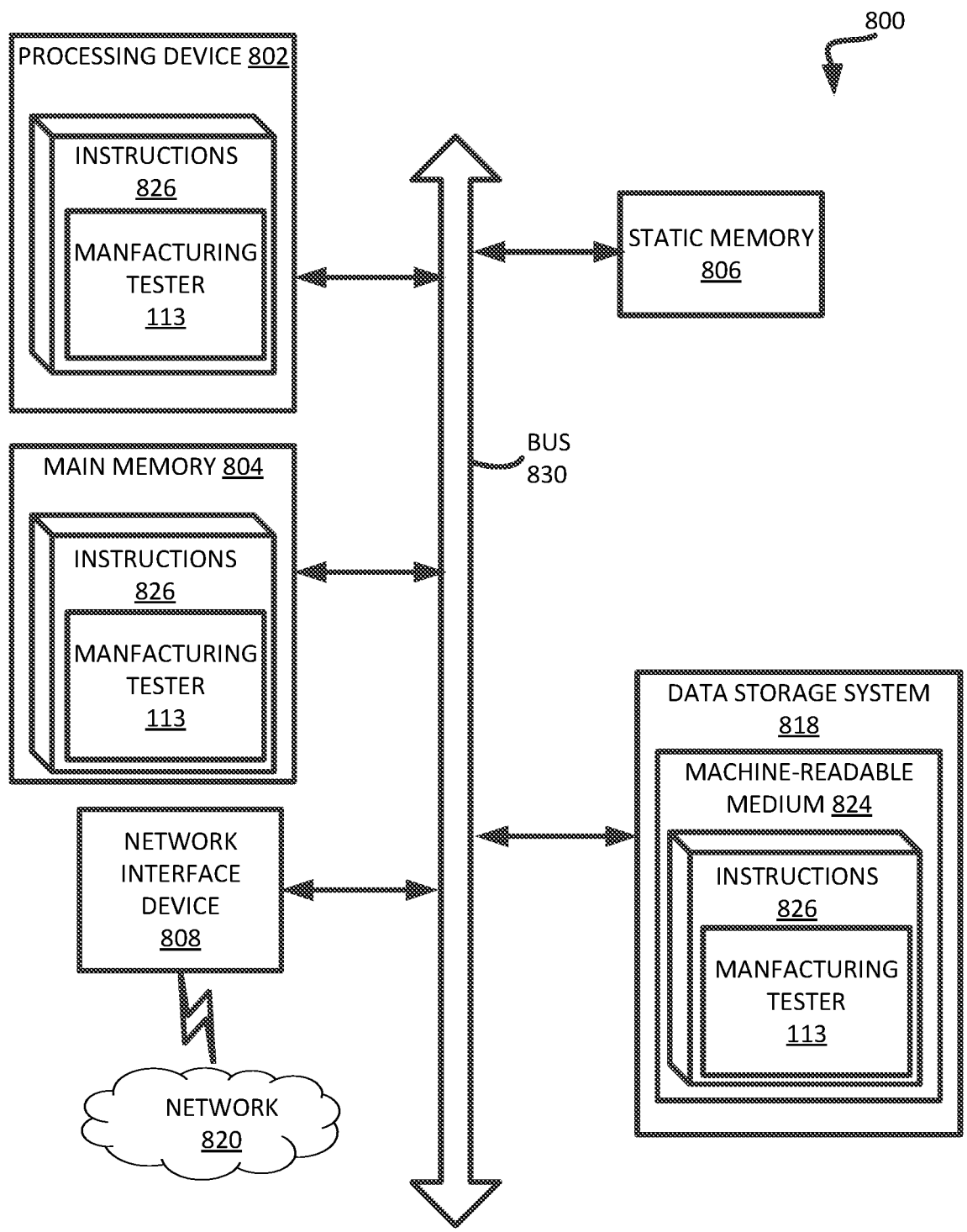
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller 115 (e.g., to execute an operating system to perform operations corresponding to the manufacturing tester 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to an error determining component (e.g., the manufacturing tester 113 of FIG. 1). While the machine-readable storage medium 824 is shown in an example embodiment to be a single medium, the term "non-transitory machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a plurality of memory dice, each memory die comprising a register to store multiple read voltage levels for the memory die; and
a processing device coupled to the plurality of memory dice, wherein to test a memory die of the plurality of memory dice, the processing device is to:
verify, via access to the multiple read voltage levels stored in the register of the memory die, whether each read voltage level falls within a corresponding relative voltage range;
select an initial read voltage level, of the multiple read voltage levels, that achieves bit error rates not satisfying a threshold criterion at one of a first or a second shortest write-to-read (W2R) delay range for the memory die;
determine a bit error rate, using the initial read voltage level, of storage units of the memory die, wherein each storage unit comprises one or more codewords; and
report the memory die as defective in response to one of: (i) a read voltage level, of the multiple read voltage levels, failing to verify; or (ii) the bit error rate of one or more storage units of the memory die satisfying the threshold criterion.

2. The system of claim 1, wherein, to verify that each read voltage level falls within a corresponding relative voltage range, the processing device is further to:
verify that a second read voltage level is higher than a first read voltage level of the multiple read voltage levels;
verify that a third read voltage level is higher than the second read voltage level; and
verify that a fourth read voltage level is higher than the third read voltage level.

3. The system of claim 1, wherein, to verify that each read voltage level falls within a corresponding relative voltage range, the processing device is further to:
verify that a second read voltage level falls between a first read voltage level plus a first minimum offset voltage and the first read voltage level plus a first maximum offset voltage;
verify that a third read voltage level falls between the first read voltage level plus a second minimum offset voltage and the first read voltage level plus a second maximum offset voltage, wherein the second minimum offset voltage is greater than the first minimum offset voltage, and wherein the second maximum offset voltage is greater than the first maximum offset voltage; and
verify that a fourth read voltage level falls between the first read voltage level plus a third minimum offset voltage and the first read voltage level plus a third maximum offset voltage, wherein the third minimum offset voltage is greater than the second minimum offset voltage, and wherein the third maximum offset voltage is greater than the second maximum offset voltage.

4. The system of claim 1, wherein to determine the bit error rate comprises to iteratively:
- sequentially write data to a number of the storage units of the memory die until expiration of an optimal W2R delay period;
- sequentially read, using the initial read voltage level, the data from the number of the storage units of the memory die until having read the number of the storage units that were previously written, wherein each read operation is performed at the optimal W2R delay period after a corresponding write operation for a storage unit of the number of storage units; and
- track the bit error rate based on the sequential reading of the data from the number of the storage units of the memory die.

5. The system of claim 4, wherein to determine the bit error rate further comprises, after a last write operation to a last storage unit of the number of the storage units, cause a delay in sequential writing until the expiration of the optimal W2R delay period.

6. The system of claim 1, wherein the processing device is further to, in response to the bit error rate of the one or more storage units exceeding the threshold criterion by no more than a threshold percentage:
- select a secondary read voltage level of the multiple read voltage levels that achieves bit error rates not satisfying a second threshold criterion at another of the first or the second shortest W2R delay range for the memory die;
- determine a second bit error rate, using the secondary read voltage level, of storage units of the memory die; and
- report the memory die as defective in response to the second bit error rate of one or more of the storage units of the memory die satisfying the second threshold criterion.

7. A method comprising testing, using at least one processing device, a plurality of memory dice of a memory sub-system during manufacturing of the memory sub-system, wherein testing a memory die of the plurality of memory dice comprises:
- verifying, via access to read voltage levels stored in the memory die, that each read voltage level falls within a corresponding relative voltage range;
- selecting an initial read voltage level, of the read voltage levels, that achieves bit error rates not satisfying a threshold criterion at one of a first, a second, or a third shortest write-to-read (W2R) delay range for the memory die; and
- performing a bit error rate check comprising:
  - writing data to storage units of the memory die;
  - reading, using the initial read voltage level, the data from the storage units of the memory die; and
  - determining a bit error rate based on the reading the data from the storage units of the memory die.

8. The method of claim 7, wherein the verifying comprises:
- (i) verifying that a second read voltage level is higher than a first read voltage level;
- (ii) verifying that a third read voltage level is higher than the second read voltage level;
- (iii) verifying that a fourth read voltage level is higher than the third read voltage level; and
- reporting the memory die as defective in response to failing to verify one of (i), (ii), or (iii).

9. The method of claim 8, wherein the verifying further comprises:
- (iv) verifying that the second read voltage level falls between the first read voltage level plus a first minimum offset voltage and the first read voltage level plus a first maximum offset voltage;
- (v) verifying that the third read voltage level falls between the first read voltage level plus a second minimum offset voltage and the first read voltage level plus a second maximum offset voltage, wherein the second minimum offset voltage is greater than the first minimum offset voltage, and wherein the second maximum offset voltage is greater than the first maximum offset voltage;
- (vi) verifying that the fourth read voltage level falls between the first read voltage level plus a third minimum offset voltage and the first read voltage level plus a third maximum offset voltage, wherein the third minimum offset voltage is greater than the second minimum offset voltage, and wherein the third maximum offset voltage is greater than the second maximum offset voltage; and
- reporting the memory die as defective in response to failing to verify one of (iv), (v), or (vi).

10. The method of claim 7, further comprising reporting the memory die as defective in response to the bit error rate of a threshold number of the storage units satisfying the threshold criterion.

11. The method of claim 7, further comprising:
- selecting a secondary read voltage level, of the read voltage levels, that achieves bit error rates not satisfying the threshold criterion at another of the first, the second, or the third shortest W2R delay range for the memory die; and
- wherein the performing the bit error rate check further comprises:
  - writing data to the storage units of the memory die;
  - reading, using the secondary read voltage level, the data from the storage units of the memory die;
  - determining a second bit error rate based on the reading of the data from the storage units of the memory die using the secondary read voltage level; and
  - reporting the memory die as defective in response to the second bit error rate of a threshold number of the storage units satisfying the threshold criterion.

12. The method of claim 7, wherein the performing the bit error rate check further comprises, iteratively, for the storage units of the memory die:
- sequentially writing to a plurality of the storage units until expiration of an optimal W2R delay period for the initial read voltage level; and
- sequentially reading from the plurality of the storage units until having read the plurality of the storage units that were previously written, wherein each read operation is performed at the optimal W2R delay period after a corresponding write operation for a storage unit of the plurality of the storage units.

13. The method of claim 12, wherein the performing the bit error rate check further comprises, after a last write operation to a last storage unit of the plurality of the storage units, causing a delay in sequential writing until expiration of the optimal W2R delay period.

14. A non-transitory machine-readable storage medium storing instructions, which when executed by a processing device, cause the processing device to, for a memory die of a plurality of memory dice of a memory sub-system:
- verify, via access to read voltage levels stored in the memory die, that each read voltage level falls within a corresponding relative voltage range;
- select an initial read voltage level, of the read voltage levels, that achieves bit error rates not satisfying a threshold criterion to one of a first, a second, or a third shortest write-to-read (W2R) delay range for the memory die;
cause data to be written to storage units of the memory die;
cause the data to be read, using the initial read voltage level, from the storage units of the memory die; and
determine a bit error rate based on reading of the data from the storage units of the memory die.

15. The non-transitory machine-readable storage medium of claim 14, wherein to verify that each read voltage level falls within a corresponding voltage range comprises to:
   (i) verify that a second read voltage level is higher than a first read voltage level;
   (ii) verify that a third read voltage level is higher than the second read voltage level;
   (iii) verify that a fourth read voltage level is higher than the third read voltage level; and
   report the memory die as defective in response to failing to verify one of (i), (ii), or (iii).

16. The non-transitory machine-readable storage medium of claim 15, wherein to verify that each read voltage level falls within a corresponding voltage range comprises to:
   (iv) verify that the second read voltage level falls between the first read voltage level plus a first minimum offset voltage and the first read voltage level plus a first maximum offset voltage;
   (v) verify that the third read voltage level falls between the first read voltage level plus a second minimum offset voltage and the first read voltage level plus a second maximum offset voltage, wherein the second minimum offset voltage is greater than the first minimum offset voltage, and wherein the second maximum offset voltage is greater than the first maximum offset voltage;
   (vi) verify that the fourth read voltage level falls between the first read voltage level plus a third minimum offset voltage and the first read voltage level plus a third maximum offset voltage, wherein the third minimum offset voltage is greater than the second minimum offset voltage, and wherein the third maximum offset voltage is greater than the second maximum offset voltage; and
   report the memory die as defective in response to failing verify one of (iv), (v), or (vi).

17. The non-transitory machine-readable storage medium of claim 14, wherein the instructions are further to cause the processing device to report the memory die as defective in response to the bit error rate of one or more of the storage units satisfying the threshold criterion.

18. The non-transitory machine-readable storage medium of claim 14, wherein the instructions are further to cause the processing device to:
   select a secondary read voltage level, of the read voltage levels, that achieves bit error rates not satisfying the threshold criterion at another of the first, the second, or the third W2R delay range for the memory die;
   again cause data to be written to the storage units of the memory die;
   cause the data to be read, using the secondary read voltage level, from the storage units of the memory die;
   determine a second bit error rate based on reading the data from the storage units of the memory die using the secondary read voltage level; and
   report the memory die as defective in response to the second bit error rate of one or more of the storage units satisfying the threshold criterion.

19. The non-transitory machine-readable storage medium of claim 14, wherein to cause the data to be written to and read from the storage units of the memory die, the instructions are further to cause the processing device to iteratively:
   cause the data to be sequentially written to a plurality of the storage units until expiration of an optimal W2R delay period for the initial read voltage level; and
   cause the data to be sequentially read from the plurality of the storage units until having read the plurality of the storage units that were previously written, wherein each read operation is performed at the optimal W2R delay period after a corresponding write operation for a storage unit of the plurality of the storage units.

20. The non-transitory machine-readable storage medium of claim 14, wherein the instructions are further to cause the processing device to:
   during a last sequential write operation to a last plurality of the storage units of the memory die, cause a delay in sequential writing until expiration of a current optimal W2R delay period; and
   cause the data to be sequentially read from the last plurality of the storage units.

* * * * *